United States Patent
Robbins et al.

(10) Patent No.: US 7,227,751 B2
(45) Date of Patent: Jun. 5, 2007

(54) VENTILATED HOUSING FOR ELECTRONIC COMPONENTS

(75) Inventors: Shane R. Robbins, Santaquin, UT (US); David Turner, Taylorsville, UT (US)

(73) Assignee: Linux Networx, Bluffdale, UT (US)

( * ) Notice: Subject to any disclaimer, the term of this patent is extended or adjusted under 35 U.S.C. 154(b) by 0 days.

(21) Appl. No.: 11/232,399

(22) Filed: Sep. 21, 2005

(65) Prior Publication Data

US 2006/0018094 A1  Jan. 26, 2006

Related U.S. Application Data

(63) Continuation of application No. 10/435,211, filed on May 9, 2003, now Pat. No. 6,975,510.

(51) Int. Cl.
*H05H 7/20* (2006.01)

(52) U.S. Cl. .................. 361/695; 361/727; 312/223.1; 312/236

(58) Field of Classification Search ................ 361/695, 361/727
See application file for complete search history.

(56) References Cited

U.S. PATENT DOCUMENTS

| | | | |
|---|---|---|---|
| 4,672,509 A | | 6/1987 | Speraw |
| 5,027,254 A | * | 6/1991 | Corfits et al. ................ 361/694 |
| D367,849 S | | 3/1996 | Pedinielli et al. |
| 5,506,751 A | | 4/1996 | Chatel |
| 5,544,008 A | | 8/1996 | Dimmick et al. |
| 5,896,273 A | | 4/1999 | Varghese et al. |
| D409,171 S | | 5/1999 | Wu |
| 5,940,288 A | | 8/1999 | Kociecki |
| 6,052,278 A | | 4/2000 | Tanzer et al. |
| 6,129,429 A | | 10/2000 | Hardt et al. |
| 6,192,401 B1 | | 2/2001 | Modiri et al. |
| 6,288,902 B1 | | 9/2001 | Kim et al. |
| 6,317,334 B1 | | 11/2001 | Abruzzini et al. |
| 6,480,391 B1 | | 11/2002 | Monson et al. |
| 6,487,080 B2 | | 11/2002 | Robbins et al. |
| 6,490,152 B1 | | 12/2002 | White et al. |
| 6,525,935 B2 | | 2/2003 | Casebolt |
| 6,885,554 B1 | * | 4/2005 | Reeck et al. ................ 361/695 |
| 6,975,510 B1 | | 12/2005 | Robbins et al. |
| 2002/0141156 A1 | * | 10/2002 | Edmunds et al. ........... 361/694 |
| 2003/0021091 A1 | | 1/2003 | Robbins et al. |

(Continued)

OTHER PUBLICATIONS

PICMG PC Industrial Computers, InfinitBand for AdvancedTCA Systems Short Form Specification, Jan. 22, 2003.

(Continued)

*Primary Examiner*—Anatoly Vortman
*Assistant Examiner*—Anthony Q. Edwards
(74) *Attorney, Agent, or Firm*—Madson & Austin (57) ABSTRACT

A structure for vertically housing an electronic component is disclosed as including a bottom support member and a top support member. The top support member is substantially parallel to the bottom support member. An open space is formed between the top support member and the bottom support member whereby the electronic component may be placed into the open space in a vertical orientation. A ventilating structure is disposed outside of the open space and is capable of channeling air into a middle portion of the electronic component in the open space.

25 Claims, 10 Drawing Sheets

U.S. PATENT DOCUMENTS

| | | |
|---|---|---|
| 2003/0081381 A1* | 5/2003 | Moizer .................. 361/690 |
| 2003/0128513 A1 | 7/2003 | Wiley |
| 2003/0223199 A1 | 12/2003 | Smith et al. |
| 2003/0231467 A1* | 12/2003 | Replogle et al. ............ 361/690 |
| 2004/0057216 A1 | 3/2004 | Smith et al. |

OTHER PUBLICATIONS

PICMG PC Industrial Computers, AdvancedTCA PICMG 3.0 Short Form Specifications, Jan. 2003.

PICMG PC Industrial Computers, CompactPCI, PICMG 2.20 R1.0, Serial Mesh Backplane Short Form Specification, Oct. 21, 2002.

PICMG PC Industrial Computers, CompactPCI, PICMG 2.14 R1.0, MultiComputing Short Form Specification, Sep. 6, 2001.

PICMG PC Industrial Computers, CompactPCI PICMG 2.16 Revision 1.0, Packet Switching Backplane Short Form Specification, Sep. 5, 2001.

PICMG PC Industrial Computers, CompactPCI PICMG 2.15 Revision 1.0, PCI Telecom Mezzanine/Carrier Card Short Form Specification, Apr. 11, 2001.

PICMG PC Industrial Computers, CompactPCI, PICMG 2.11 Revision 1.0 Power Interface Short Form Specification, Oct. 1, 1999.

* cited by examiner

VENTILATED HOUSING FOR ELECTRONIC
COMPONENTS

CROSS-REFERENCE TO RELATED APPLICATION

This application is a continuation of U.S. patent application Ser. No. 10/435,211, filed May 9, 2003, and now issued as U.S. Pat. No. 6,975,510.

TECHNICAL FIELD

This invention relates generally to housings for electronic components, and is more particularly directed toward a ventilated housing for electronic components.

BACKGROUND

As the size and complexity of software and computer-related tasks grow, the ability of a single computer to handle all of the requirements associated with the software diminishes. One way to handle these increasingly complex software systems and tasks is to use a group of computers rather than just a single computer. Groups of computers are often placed in racks where they may be physically grouped together.

Other electronic components may also be placed in racks. Electronic components may include, but are not limited to, an Uninterruptible Power Supply (UPS), a switch, a router, a hub, etc. The more electronic hardware that is needed at a particular location, the more likely it is that a rack or similar type of structure capable of holding multiple electronic components may be needed.

Typically large racks are used to hold multiple computer systems or to hold multiple electronic components. Generally, a user needs tools and time to place a computer system or electronic component into such a rack or to remove it. It is desirable to provide structures for holding computer systems or electronic components, to provide structures that allow the computers or electronic components to be more efficiently placed into and/or removed from a rack, and/or to meet necessary density requirements.

A computer or an electronic component may have problems with one or more of its electronic parts if it overheats. This problem is exacerbated by electronic devices being placed close together in large groups because of the combined heat being generated by all of the devices. Thus, it would be beneficial if systems and methods were available to provide adequate cooling for groups of electronic devices.

BRIEF DESCRIPTION OF THE DRAWINGS

The present embodiments will become more fully apparent from the following description and appended claims, taken in conjunction with the accompanying drawings. Understanding that these drawings depict only typical embodiments and are, therefore, not to be considered limiting of the invention's scope, the embodiments will be described with additional specificity and detail through use of the accompanying drawings in which:

DETAILED DESCRIPTION

It will be readily understood that the components of the embodiments as generally described and illustrated in the Figures herein could be arranged and designed in a wide variety of different configurations. Thus, the following more detailed description of the embodiments of the methods and apparatus of the present invention, as represented in the Figures, is not intended to limit the scope of the invention, as claimed, but is merely representative of the embodiments of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

Furthermore, the described features, structures, or characteristics may be combined in any suitable manner in one or more embodiments. In the following description, numerous specific details are shown to provide a thorough understanding of embodiments of the invention. One skilled in the relevant art will recognize, however, that the invention may be practiced without one or more of the specific details, or with other methods, components, materials, etc. In other instances, well-known structures, materials, or operations are not shown or described in detail to avoid obscuring aspects of the invention.

A structure for vertically housing electronic components is broadly disclosed. The electronic components may be embodied in many different forms including, but not limited to, computer systems, routers, switches, hubs, Uninterruptible Power Supplies (UPS), etc. The structure will first be described below in relation to use with computer systems. Following the embodiments directed towards computer systems, additional embodiments are described that are directed more broadly toward any electronic component.

An embodiment of a structure for housing multiple computer systems is disclosed. Multiple computer systems may be placed together in a rack, cabinet, enclosure, etc., for various reasons. Examples are large scale web sites, hosting providers, ISPs, or other large scale Internet-based operations. Computers used for these purposes are usually close together because they are at the same location which makes it easier to support and maintain the computers.

Figure 1:
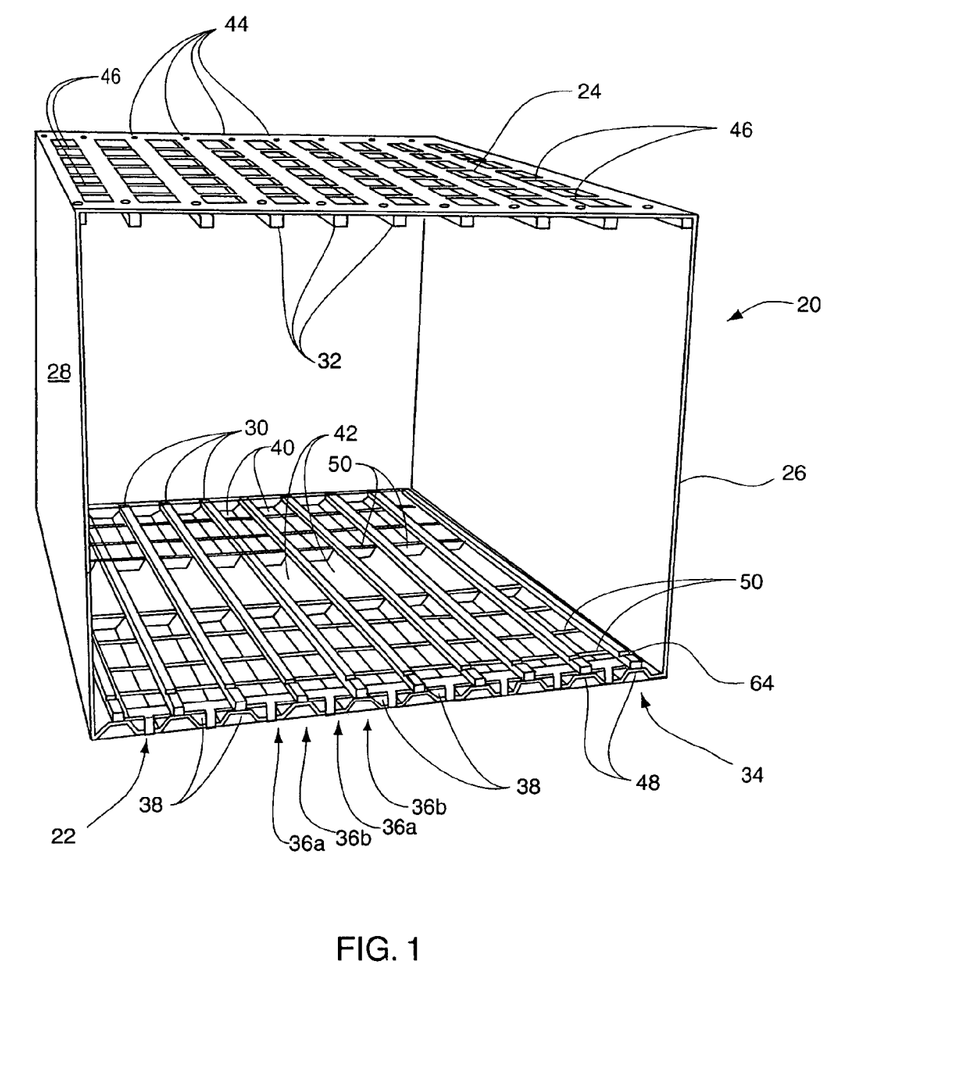
FIG. 1 is a perspective view of an embodiment of a sub rack with a ventilating structure.

The structure for vertically housing multiple computer systems may be embodied in various forms and through various materials. FIG. 1 is a perspective view of an embodiment of the structure that may be used in combination with a rack (not shown). The embodiment illustrated in FIG. 1 is referred to herein as a sub rack 20. The sub rack 20 includes a bottom support member 22 and a top support member 24 connected to each other through two side members, a first side member 26 and a second side member 28. Those skilled in the art will appreciate the various ways in which these components may be made. In addition, there are a number of ways in which these components may be connected. For example, the components may be connected through the use of fasteners (screws, swedge mounted nuts, clips, etc.), or through welding, etc.

Figure 2:
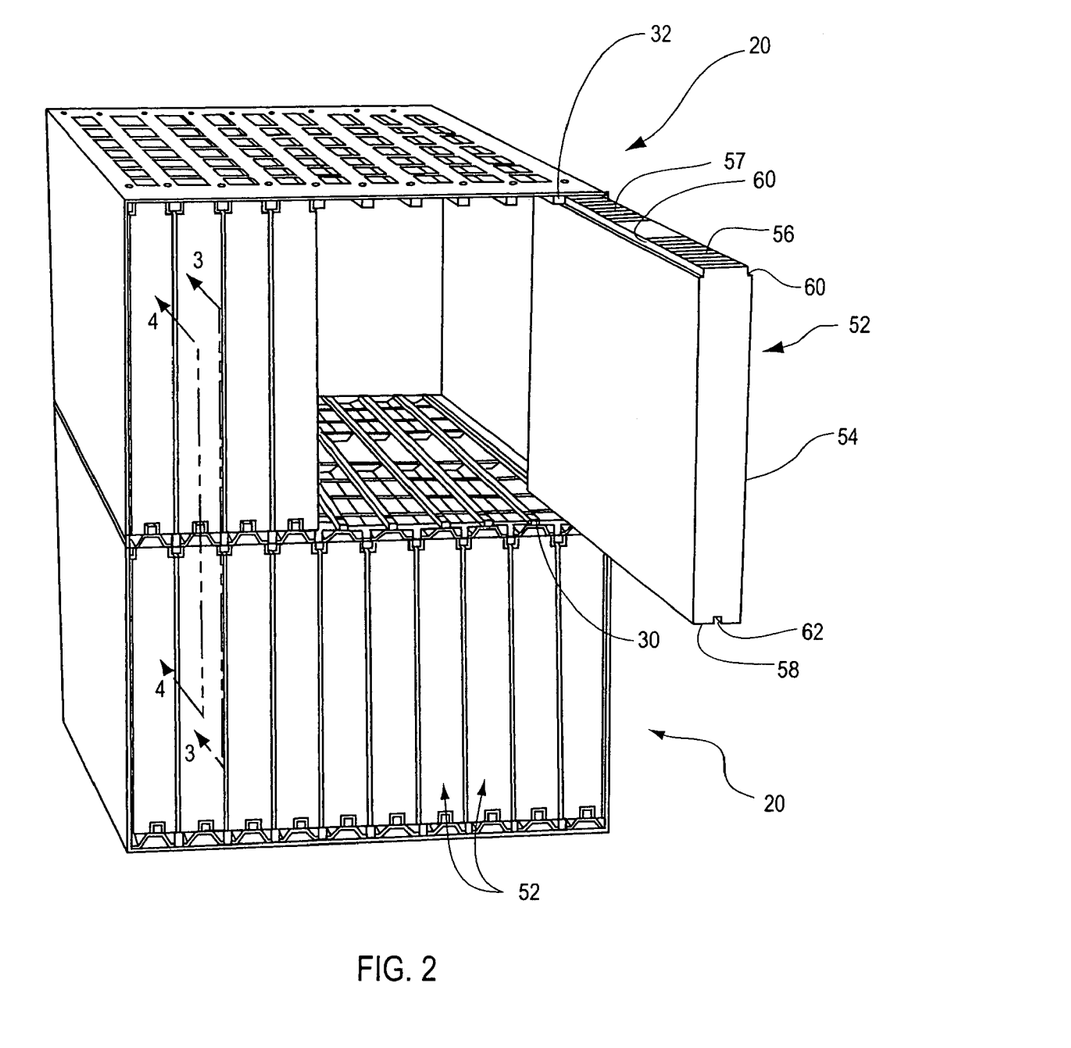
FIG. 2 is a perspective view of two sub racks being used to house multiple computer systems.

The bottom support member 22 of the embodiment shown in FIG. 1 includes a plurality of bottom guides 30 mounted to the bottom support member 22. Similarly, the top support member 24 of the embodiment shown in FIG. 1 includes a plurality of top guides 32 mounted to the top support member 24. The open space between the top and bottom support members 24, 22 and between the side members 26, 28 is used for holding computer systems 52. The computer systems 52 are placed into a computer space, as shown in FIG. 2. The guides 30, 32 are used to hold the computer system in place, as will be discussed more fully below.

In one embodiment, the guides 30, 32 may be made out of ultra high molecular weight polyethylene. Alternatively, the guides 30, 32 may be made out of nylon, delron, aluminum, or any variety of plastics or metals. The guides 30, 32 may be cut, milled, molded, or formed in various other ways, as will be appreciated by those skilled in the art. The guides 30, 32 may be attached via screws threaded into the material. Inserts may also be used. Alternatively, an adhesive may be used to attach the guides 30, 32 to the support members 22, 24. In addition, the guides 30, 32 may be an integral part of the support members 22, 24.

The sub rack 20 includes a ventilating structure 34. The embodiment of the ventilating structure 34 shown in FIG. 1 includes a plurality of airways 36 positioned outside of the computer space. The airways 36 may be integrated with the bottom support member 22, as shown in FIG. 1. The embodiment of FIG. 1 illustrates a structure that serves as both the bottom support member 22 and that also includes the ventilating structure 34. In alternative embodiments, the ventilating structure 34 may be integrated with the top support member 24. In a further alternative embodiment, the ventilating structure 34 may be a separate component and may not be integrated with or be part of the top support member 24 or the bottom support member 22.

Each airway 36 includes an inlet airway 38, an outlet airway 40 and an air dam 42 therebetween. The plurality of inlet airways 38 provide intake air to the computer systems. The plurality of outlet airways 40 are used to exhaust used air from the computer systems. The air dams 42 separate the inlet airways 38 from their corresponding outlet airways 40.

The plurality of airways 36 ventilate computers systems above and below the plurality of airways 36 by having alternating airways ventilate computer systems above the plurality of airways 36 and by having alternating airways ventilate computer systems below the plurality of airways 36. This ventilation will be more fully explained and illustrated with respect to FIGS. 3–5. With respect to FIG. 1, alternating airways 36a serve to ventilate the computer system above the plurality of airways 36. The other set of alternating airways 36b serve to ventilate the computer system below the plurality of airways 36.

The top support member 24 and the bottom support member 22 are both substantially open to allow air to flow into and out of the airways 36 and into and out of computer systems 52. The top support member 24 includes a plurality of top guide supports 44. The top guides 32 are mounted to the top guide supports 44. The top support member 24 also includes a plurality of cross supports 46 that are substantially perpendicular to the top guide supports 44, as shown.

The bottom support member 22 includes a plurality of bottom guide supports 48. The bottom guides 30 are mounted to the bottom guide supports 48. The bottom support member 22 also includes a plurality of cross supports 50 that are substantially perpendicular to the bottom guide supports 48, as shown.

As mentioned above, the embodiment of FIG. 1 illustrates a structure that serves as both the bottom support member 22 and that also includes the ventilating structure 34. Those skilled in the art will appreciate that the ventilating structure 34 may be a separate component and may not be integrated with the top support member 24 or the bottom support member 22.

The sub rack 20 may be used to house multiple computer systems or any other type of electronic device or component. FIG. 2 is a perspective view of two sub racks 20 being used to house multiple computer systems 52. One computer system 52 is shown only partially inserted into its sub rack 20.

The computer system 52 includes a housing 54 for the components of the computer system 52. As shown, the housing 54 is substantially rectangular and includes a top 56, a bottom 58 and a rear. The top 56 includes venting 57 that allows airflow into and out of the computer system 52. The bottom 58 also includes venting 59 that allows airflow into and out of the computer system.

The top 56 includes two top grooves 60 that allow top guides 32 to fit therein and slide therethrough, as shown. Similarly, the bottom 58 includes a bottom groove 62 that allows a bottom guide 30 to fit therein and slide therethrough. In operation, to place a computer system 52 into the sub rack 20, a user aligns the top grooves 60 with two top guides 32 and aligns the bottom groove 62 with a bottom guide 30 and then the user simply slides the computer system 52 into the sub rack 20. Matching guides 30, 32 are used for a particular computer system 52. For example, the first two top guides 32 from the right are used in conjunction with the first bottom guide 30 from the right to slide a computer system 52 into the sub rack 20. Through the use of the guides 30, 32 and the sub rack 20, the computer system 52 is vertically placed into the sub rack 20. A plurality of computer systems 52 may all be placed vertically in the sub rack 20 in a side-by-side fashion, as shown. Multiple sub racks 20 may be used and placed in a vertical stack, as shown, to house multiple sub racks 20 of computer systems 52.

A larger rack (not shown) may be used to hold the multiple sub racks 20. The sub rack 20 may be placed into a larger rack, sometimes referred to as a modular rack, a data rack or a cabinet. Depending on the height and/or size of the rack and the size of the computer systems 52, various numbers of computer systems 52 may be placed into a sub rack 20. One standard rack size is a 19-inch rack. The sub rack 20 may be designed to fit into any sized rack, including the 19-inch rack.

The housing 54 may be made using standard manufacturing techniques known by those skilled in the art. Different types of materials may be used for the housing 54 including a variety of plastics, metals, etc. For example, cold rolled steel, aluminum or aircraft aluminum may be used. These different materials may be formed, machined, molded, etc. to form the housing 54.

Although the embodiments of FIGS. 1 and 2 illustrate one bottom guide 30 being used in combination with two top guides 32 to align and position a computer system 52, it will be appreciated that other configurations are also possible. For example, systems and methods for housing a computer system in a vertical orientation with one bottom guide 30 and one top guide 32 are disclosed in "Sub Rack Based Vertical Housing For Computer Systems," U.S. Pat. No. 6,487,080, assigned to the assignee hereof, which is incorporated herein by reference. Such systems and methods may be used with embodiments herein. As will be shown below, further embodiments may be used that do not include any guides.

The present systems and methods may be used with electronic components that slide into a backplane, or they may be used with electronic components that do not slide into a backplane. In the embodiments of FIGS. 1 and 2, the computer system 52 slides back to the rear of the sub rack 20 which is a non-backplaned rear. The term non-backplaned rear means that there is not a backplane along the rear of the sub rack 20 that the computer would need to plug into or slide into to enable electronic communications with other components also in communication with the backplane. The sub rack 20 may be substantially open in the rear to facilitate use with a non-backplaned rear. However, the present systems and methods may easily be used with computer systems or electronic components that do slide into a backplane.

Typically the computer 52 slides smoothly along the guides 30, 32 into the computer space. Because there is no backplane, the computer 52 may slide when it is undesirable. A semi-locking mechanism may be included to provide some means for the computer 52 to be semi-locked into position. An integrated semi-locking mechanism may be used. As shown in FIGS. 1 and 2, each bottom guide 30 includes an indentation 64 to mate with a projection in the bottom groove 62 that provides a semi-locking mechanism that does not require tools to put the computer 52 in place. A user simply slides the computer 52 into the computer space until the projection fits into the indentation 64 and seats itself 52 into place. To unlock the computer 52, a user slightly lifts and then pulls the node 52 enough to bring the projection out of the indentation 64 thus allowing free sliding of the computer 52.

Figure 3:
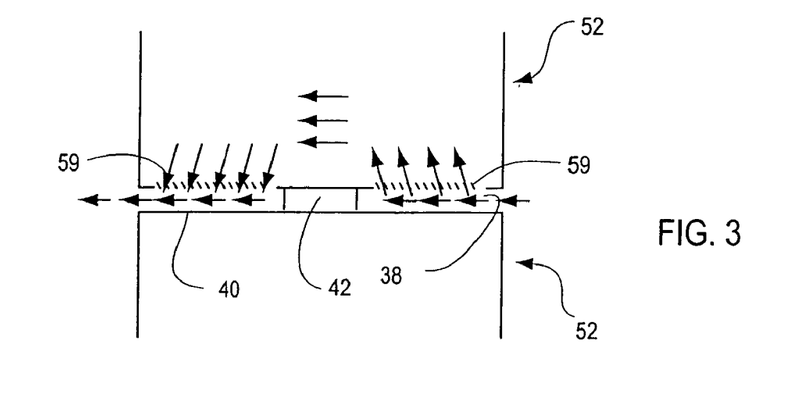
FIG. 3 is a cross-sectional view of a portion of FIG. 2 taken along line 3—3.

FIG. 3 is a cross-sectional view of a portion of FIG. 2 taken along line 3—3. FIG. 3 illustrates the air flowing into the inlet airway 38 and up through venting 59 on the bottom of the computer system 52. As shown, fresh air is brought into the middle portion of the computer system 52 directly through the inlet airway 38. When air is only allowed to flow in from the front part of the computer system 52, by the time the air gets to the middle of the computer system 52 it is not as fresh as in the embodiments shown herein where fresh air is brought directly into the middle of the computer system 52 via the inlet airways 38.

The air dam 42 helps force the fresh air up into the computer system 52. The fresh air then acts to cool and provide ventilation to the computer system 52. The used air is then provided an outlet through the outlet airway 40.

Figure 4:
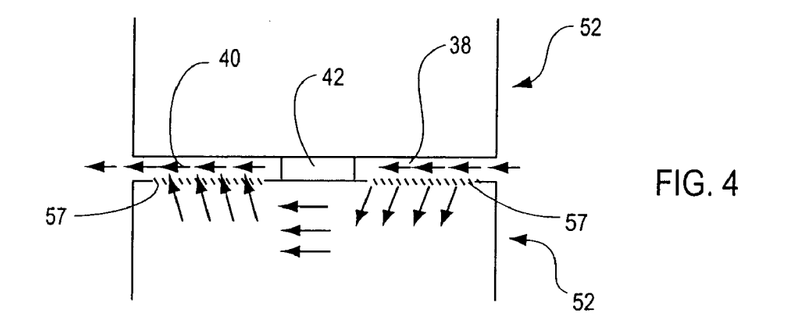
FIG. 4 is a cross-sectional view of a portion of FIG. 2 taken along line 4—4.

As discussed above, the plurality of airways 36 ventilate computers systems above and below the plurality of airways 36 by having alternating airways ventilate computer systems above the plurality of airways 36 and by having alternating airways ventilate computer systems below the plurality of airways 36. The airway 36 illustrated in FIG. 3 ventilates the computer system 52 above the airway. The airway 36 illustrated in FIG. 4 ventilates the computer system 52 below the airway 36. Thus, FIGS. 3 and 4 illustrate the two different types of airflow. In the embodiments shown in FIGS. 1–4, alternating airways 36 ventilate the computer system 52 above the airways, as shown in FIG. 3, and the adjacent airways 36 ventilate the computer systems 52 below, as shown in FIG. 4.

FIG. 4 is a cross-sectional view of a portion of FIG. 2 taken along line 4—4. FIG. 4 illustrates the air flowing into the inlet airway 38 and down through venting 57 on the top of the computer system 52. As shown, fresh air is brought into the middle portion of the computer system 52 directly through the inlet airway 38. The air dam 42 helps force the fresh air down into the computer system 52. The fresh air then acts to cool and provide ventilation to the computer system 52. The used air is then provided an outlet through the outlet airway 40.

Figure 5:
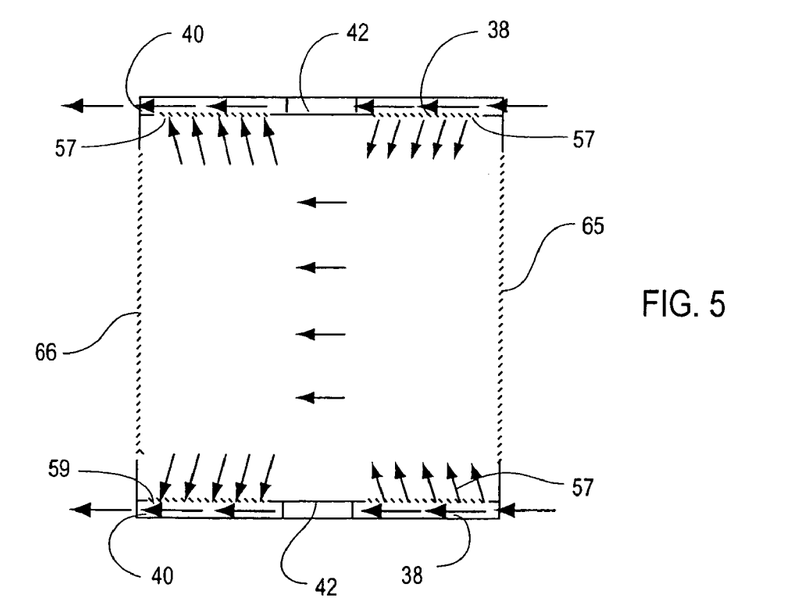
FIG. 5 is a side-elevational cross-sectional view of a computer system.

FIG. 5 is a side-elevational cross-sectional view of a computer system 52 that illustrates the airflow coming in from the top and the bottom of the computer system 52. With a ventilating structure 34 disposed below the sub rack 20 and a ventilating structure 34 disposed above the sub rack 20, the computer system 52 is ventilated as shown in FIG. 5. Fresh air flows in through the inlet airways 38 and through the ventings 57, 59 to the middle portion of the computer system 52. By middle portion it is meant not at the immediate front or the immediate rear of the computer system 52. The air is then used to cool the components of the computer system 52. The used air is exhausted through the outlet airways 40.

FIG. 5 also illustrates that a front venting 65 may be included on the front of the computer system 52 and a rear venting 66 may be included on the rear of the computer system 52. This additional venting may also help to further ventilate the computer system 52.

Figure 6:
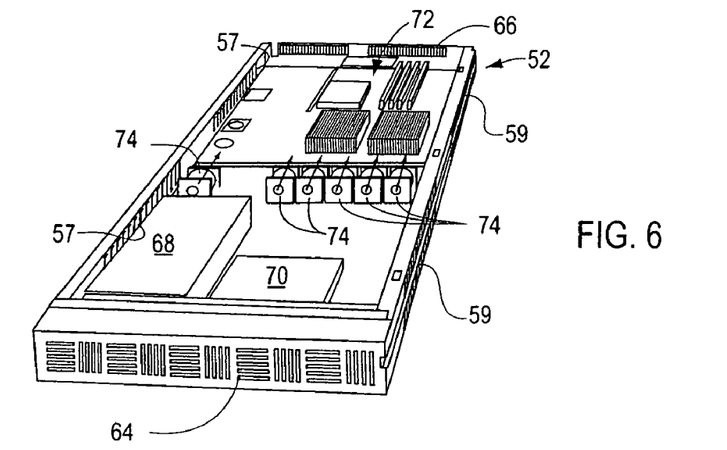
FIG. 6 is a perspective view of an embodiment of a computer system with an open housing.

In the embodiments disclosed herein fans may be used to cause the airflow. FIG. 6 illustrates a typical computer system 52 that may be used. The computer system 52 includes a power supply 68, a storage device 70 and a motherboard 72. The motherboard 72 may include a number of components including one or more processors, memory, controllers, input/output components, etc. Various kinds of computer systems 52 and computer components are readily available.

The computer system 52 of FIG. 6 includes a number of fans 74 placed in the middle portion of the computer system 52 and disposed such that the fans 74 help pull air from the inlet airways 38 through the ventings 57, 59 into the computer system and blow this fresh air across the heat sources on the mother board 72. The used air may then travel out of the computer system 52 through the ventings 57, 59 and through the outlet airways 40. There may also be a front venting 65 and a rear venting 66 to provide additional airflow.

Figure 7:
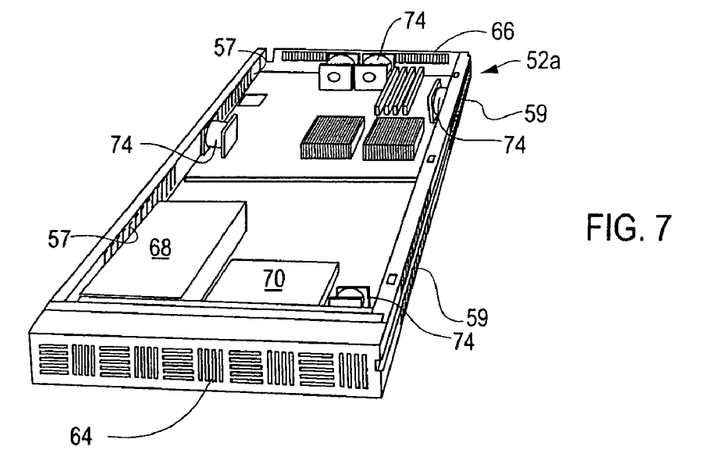
FIG. 7 is a perspective view of another embodiment of a computer system with an open housing.
Figure 8:
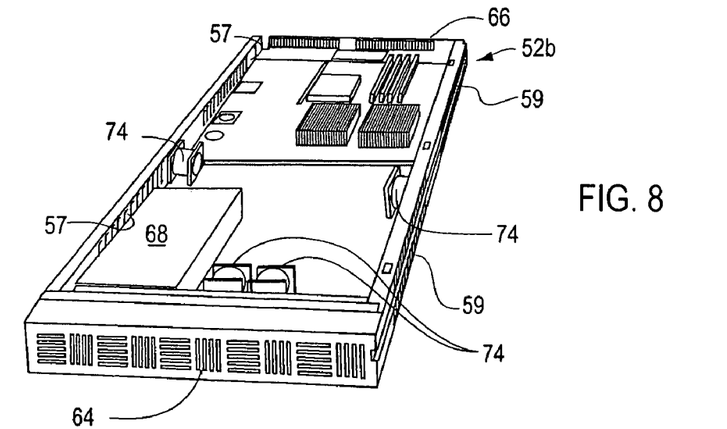
FIG. 8 is a perspective view of still further embodiment of a computer system with an open housing.

Fans 74 may be configured in various ways to achieve the desired airflow. FIG. 7 illustrates an alternative configuration of the fans 74 in the computer system 52*a* that achieves the desired airflow. FIG. 8 illustrates a further configuration of the fans 74 in the computer system 52*b* that achieve the desired airflow.

Figure 9:
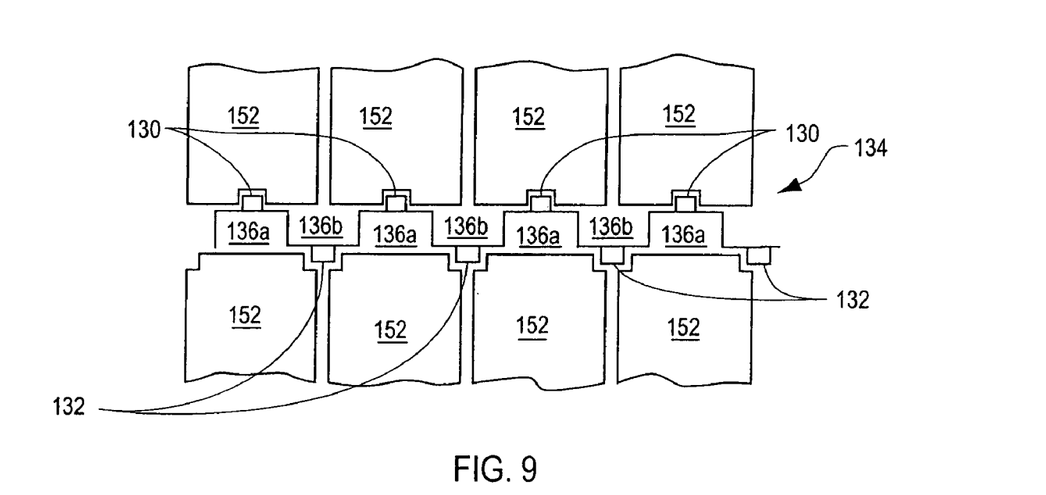
FIG. 9 is a cross-sectional view of another embodiment of a ventilating structure.

FIG. 9 illustrates another embodiment of a ventilating structure 134. FIG. 9 illustrates a cross-sectional view of the ventilating structure 134 with a row of computer systems 152 above the ventilating structure 134 and with a row of computer systems 152 below the ventilating structure 134. The ventilating structure 134 includes a plurality of airways 136 positioned outside of the computer space. The airways 136 may be integrated with the bottom support member 22 and or the top support member 24. The ventilating structure 134 includes airways 136 with substantially perpendicular angles forming the airways 136, as shown.

Figure 10:
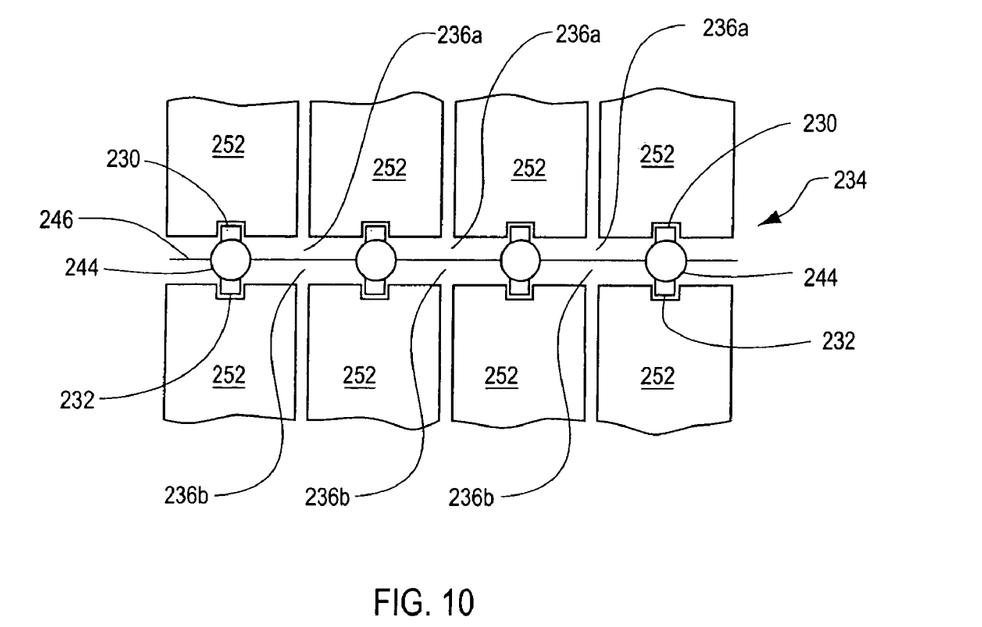
FIG. 10 is a cross-sectional view of another embodiment of a ventilating structure.

FIG. 10 illustrates another embodiment of a ventilating structure 234. FIG. 10 illustrates a cross-sectional view of the ventilating structure 234 with a row of computer systems 252 above the ventilating structure 234 and with a row of computer systems 252 below the ventilating structure 234. The ventilating structure 234 includes a plurality of airways 236 positioned outside of the computer space. The airways 236 may be integrated with the bottom support member 22 and or the top support member 24.

The top guides 232 and the bottom guides 230 are mounted to guide supports 244. Cross supports 246 hold the guide supports 244 in place. The cross supports 246 in combination with the guide supports 244 form a plurality of airways 236. In this embodiment of FIG. 10, the upper airways 236*a* provide air to and from the computer systems 252 above the ventilating structure 234 and lower airways 236*b* provide air to and from the computer systems 252 below the ventilating structure 234.

Figure 10A:
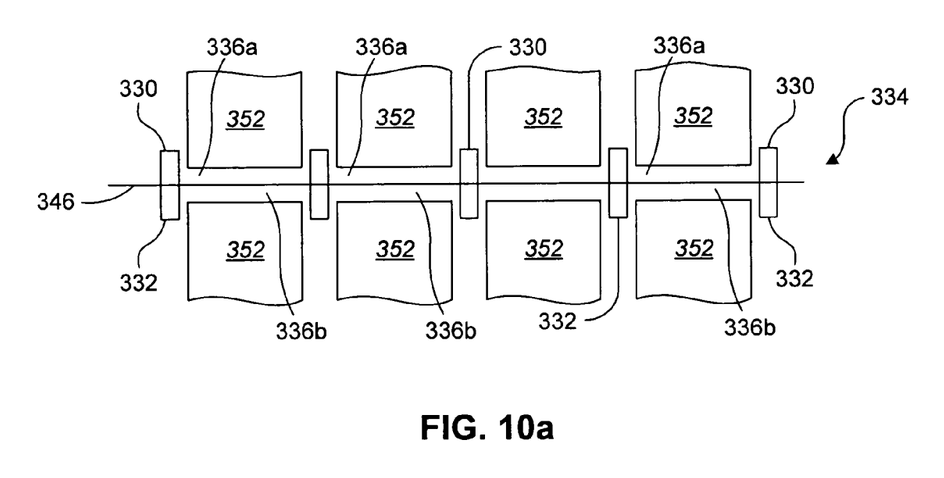
FIG. 10a is a cross-sectional view of another embodiment of a ventilating structure.

FIG. 10*a* illustrates another embodiment of a ventilating structure 334. FIG. 10*a* illustrates a cross-sectional view of the ventilating structure 334 with a row of computer systems 352 above the ventilating structure 334 and with a row of computer systems 352 below the ventilating structure 334. The ventilating structure 334 includes a plurality of airways 336 positioned outside of the computer space. The airways 336 may be integrated with the bottom support member 22 and or the top support member 24.

The top guides 332 and the bottom guides 330 are mounted to cross supports 346. The cross supports 346 in combination with the guides 330, 332 form a plurality of airways 336. In this embodiment of FIG. 10*a*, the upper airways 336*a* provide air to and from the computer systems 352 above the ventilating structure 334 and lower airways 336*b* provide air to and from the computer systems 352 below the ventilating structure 334.

Figure 11:
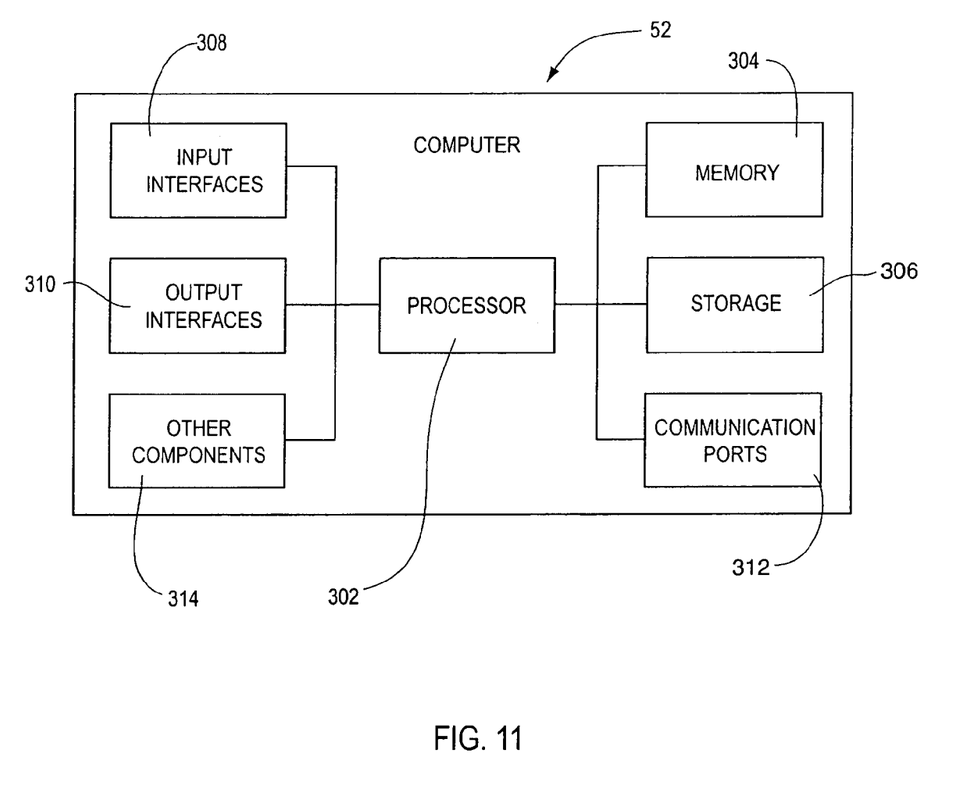
FIG. 11 is a block diagram of hardware components that may be used in an embodiment of a computer system.

FIG. 11 is a block diagram of hardware components that may be used in an embodiment of a computer system 52. Many different types of computers and computer components may be used to implement the computer system 52 illustrated herein. The diagram of FIG. 11 illustrates typical components of a computer system 52 including a processor 302, memory 304, a storage device 306, an input interface 308, and an output interface 310. One or more communication ports 312 may also be included in the computer system 52. It will be appreciated by those skilled in the art that more components may be included in the computer system 52. For example, several input interfaces 308 may be included, such as interfaces for a keyboard, a mouse, a joystick, a touch screen, etc. In addition, several output interfaces 310 may be included such interfaces for a monitor, speakers, a printer, etc. Thus, those skilled in the art will appreciate that additional components may be added to the computer system 52 without detracting from the functionality to serve as a computer system 52.

Figure 12:
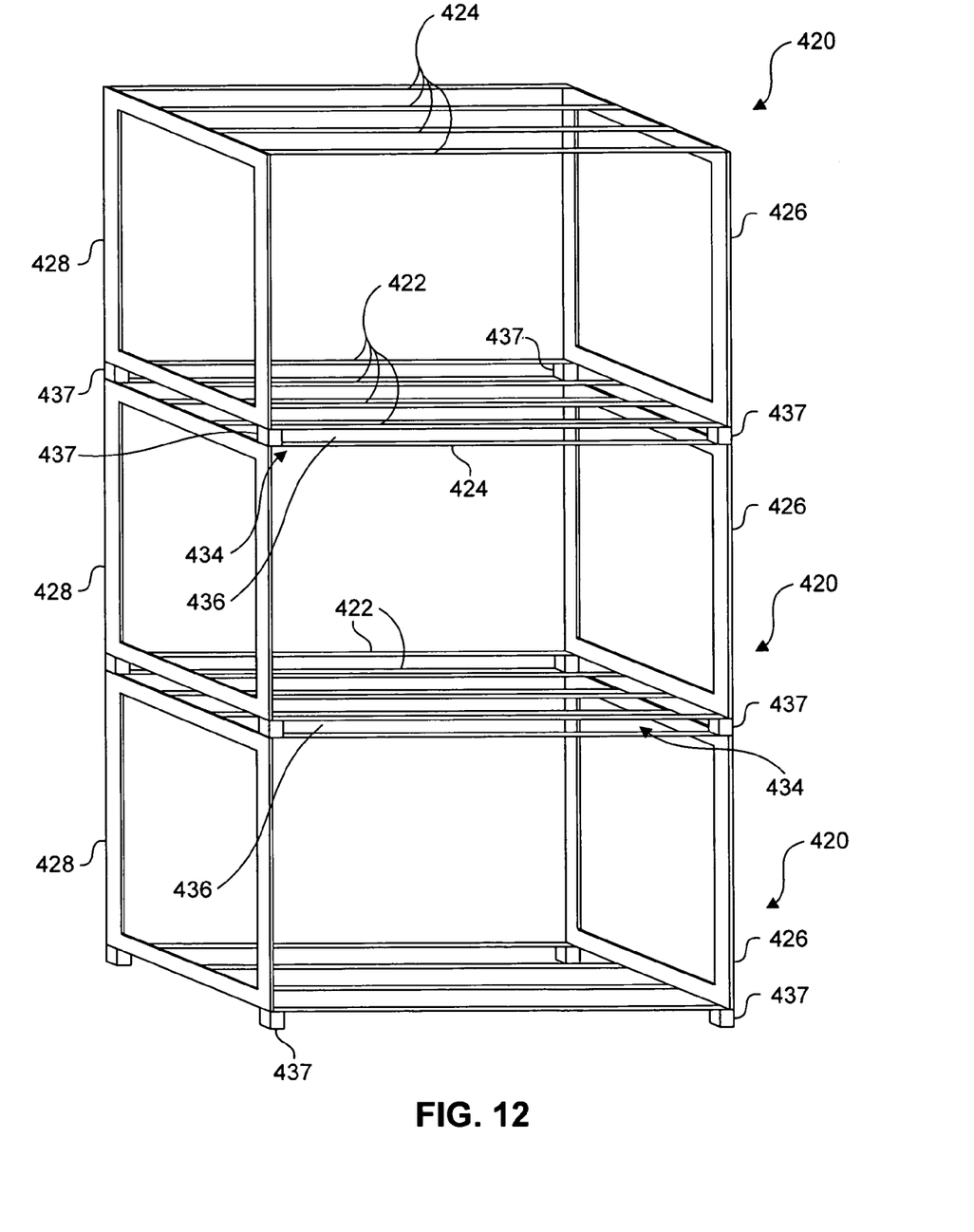
FIG. 12 is a perspective view of several other embodiments of a sub rack.

As stated earlier, the structure for vertically housing multiple computer systems may be embodied in various forms and through various materials. FIG. 12 is a perspective view of another embodiment of the structure that may be used in combination with a rack. There are three sub racks 420 illustrated in FIG. 12. The sub rack 420 includes multiple bottom support members 422 and multiple top support members 424 connected to each other through two side members, a first side member 426 and a second side member 428. The side members 426, 428 of FIG. 12 are substantially rectangular frames. Those skilled in the art will appreciate the various ways in which these components may be made. In addition, there are a number of ways in which these components may be connected. For example, the components may be connected through the use of fasteners (screws, swedge mounted nuts, clips, etc.), or through welding, etc.

The open space between the top and bottom support members 424, 422 and between the side members 426, 428 is used for holding electronic components. The electronic components (not shown in FIG. 12) are placed into the open space, as shown in FIG. 2. It will be noted that there are no guides used with the embodiments shown in FIG. 12. The electronic components simply slide into the open space and are kept in place by the support members 424, 422.

The sub rack 420 includes a ventilating structure 434. The ventilating structure 434 includes an airway 436 positioned outside of the open space. The airway 436 is an open space that will be oriented between two sub racks 420. Spacer blocks 437 may be used to separate the sub racks 420 and provide the airway 436 in between the sub racks 420. The airway 436 is used to bring air into the electronic components and also to exhaust used air from the electronic components.

The top support member 424 and the bottom support member 422 are both substantially open to allow air to flow into and out of the airway 436 and into and out of electronic components.

Figure 13:
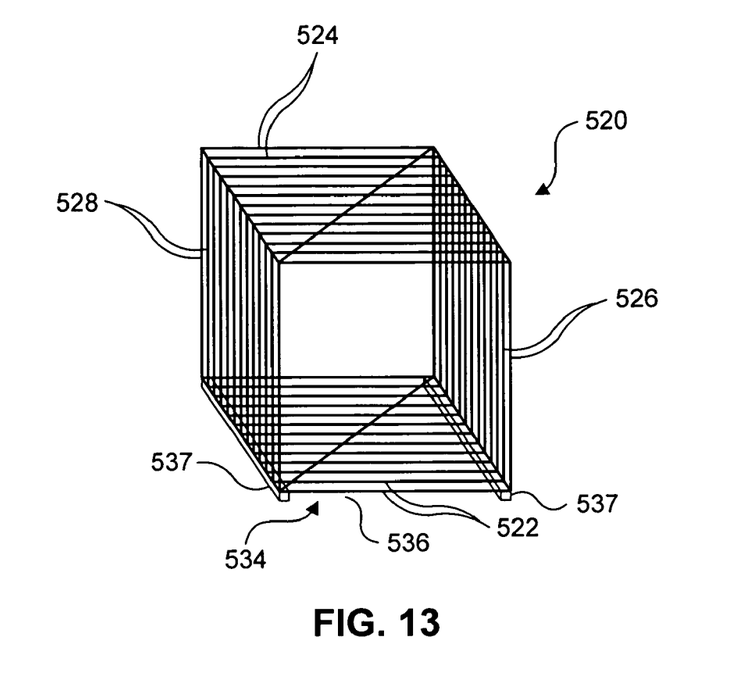
FIG. 13 is a perspective view of a still further embodiment of a sub rack.

FIG. 13 is a perspective view of another embodiment of a sub rack 520. The sub rack 520 includes multiple bottom support members 522 and multiple top support members 524 connected to each other through multiple side members, first side members 526 and second side members 528. As shown and illustrated in FIG. 13, the sub rack 520 may be embodied by a cage-like structure.

The open space between the top and bottom support members 524, 522 and between the side members 526, 528 is used for holding electronic components. The electronic components are placed into the open space. It will be noted that there are no guides used with the embodiment shown in FIG. 13. The electronic components simply slide into the open space and are kept in place by the cage-like structure.

The sub rack 520 includes a ventilating structure 534. The ventilating structure 534 includes an airway 536 positioned outside of the open space. The airway 536 is an open space that may be oriented between two sub racks 520. Spacers 537 may be used to separate the sub racks 520 and provide the airway 536 in between the sub racks 520. The airway 536 is used to bring air into the electronic components and also to exhaust used air from the electronic components. The top and bottom of the sub rack 520 are both substantially open to allow air to flow into and out of the airway 536 and into and out of the electronic components 52.

Figure 14:
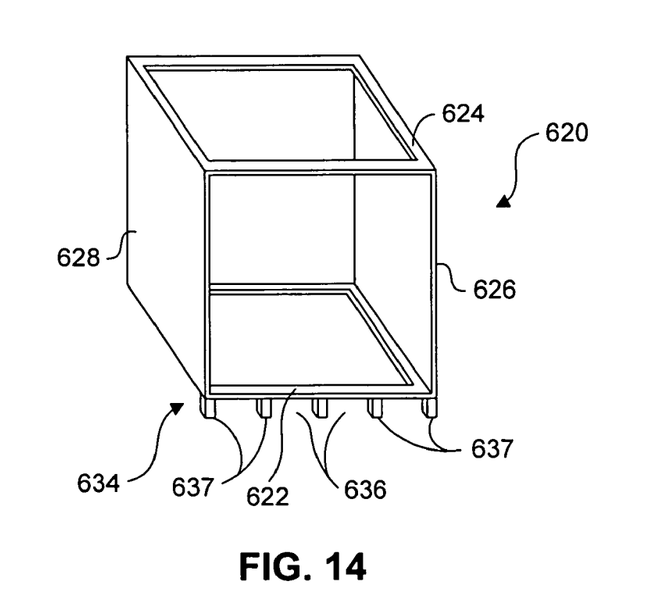
FIG. 14 is a perspective view of another embodiment of a sub rack.

FIG. 14 is a perspective view of another embodiment of a sub rack 620. The sub rack 620 includes a frame-like bottom support member 622 and a frame-like top support member 624 connected to each other through two side members, a first side member 626 and a second side member 628.

The open space between the top and bottom support members 624, 622 and between the side members 626, 628 is used for holding electronic components. As with earlier embodiments, the electronic components are placed into the open space.

The sub rack 620 includes a ventilating structure 634. The ventilating structure 634 includes an airway 636 positioned outside of the open space. The airway 636 is an open space that may be oriented between two sub racks 620. Spacer blocks 637 may be used to separate the sub racks 620 and provide the airway 636 in between the sub racks 620. The airway 636 is used bring air into the computer systems and also to exhaust used air from the computer systems. The top and bottom of the sub rack 620 are both substantially open to allow air to flow into and out of the airway 636 and into and out of the electronic components.

Figure 15:
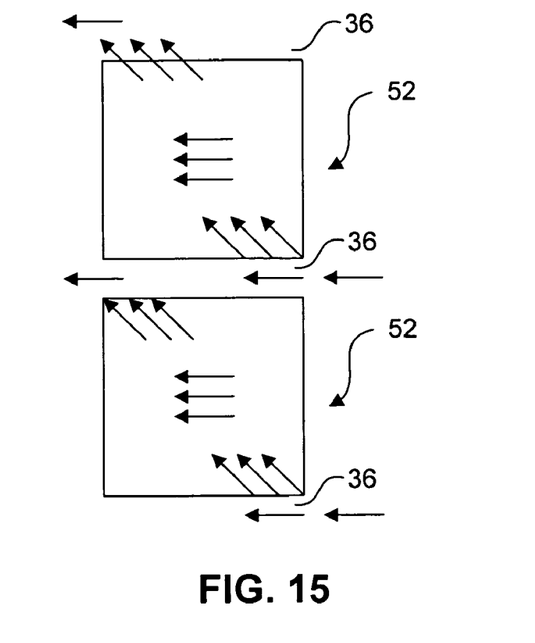
FIG. 15 is a side-elevational cross-sectional view of electronic components illustrating an additional embodiment of airflow across the components.

FIGS. 3–5 illustrated various ways in which the air may flow through a computer system. FIG. 15 is a side-elevational cross-sectional view of electronic components that illustrate an additional embodiment of airflow across the electronic components. As shown, fresh air is brought into the middle portion of the electronic component 52 directly through the airway 36. The fresh air then acts to cool and provide ventilation to the electronic component 52. The used air is then provided an outlet through the airway 36 above. The airway 36 ventilates the electronic components 52 above and below the airway.

As set forth above, the systems and methods disclosed herein may be used with electronic components 452 that are not necessarily computer systems. The electronic components 452 may be any electronic device including but not limited to a UPS, a switch, a single board computer, a router, etc. The electronic component 452 may be partially or fully enclosed. In the embodiment shown in FIG. 16, the electronic component 452 is partially enclosed: it includes a bottom 473 and sides 461. By adding a top (not shown), the component 452 may have been fully enclosed.

Figure 16:
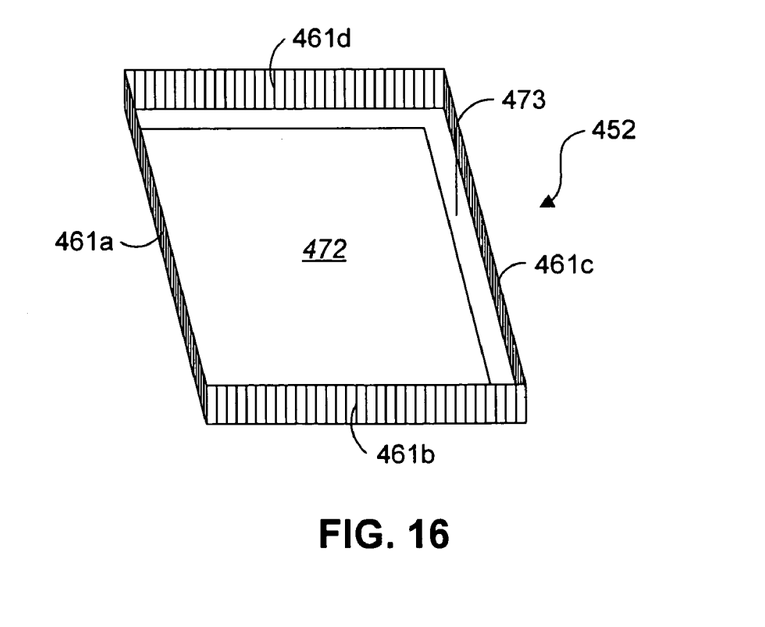
FIG. 16 is a perspective view of an embodiment of an electronic component with an open housing.

The electronic components 452 need not have any fans. The electronic component 452 may simply include a printed circuit board (PCB) 472. The electronic component 452 shown may be cooled by the air flow across the PCB 472. The air flow may be natural air flow. Convection may be used to cool the electronic component 452. It will be appreciated by those skill in the art that may different means may be used to cool the computer system 452 including fans, convection, natural air flow, external pressure, etc.

The electronic component 452 includes a bottom 473 on which the printed circuit board 472 is mounted. As shown, the electronic component 452 may include a number of sides 461 connected to the bottom 473. The sides 461 may include vents to ventilate the electronic component by allowing air to flow through the vents. The vents may be positioned such that an at lease partially vertical air flow may travel accross the electronic component 452. Several examples of such air flows have been described herein.

The present invention may be embodied in other specific forms without departing from its spirit or essential characteristics. The discribed embodiments are to be considered in all respects only as illustrative, and not restrictive. The scope of the invention is, therefore, indicated by the appended claims, rather than by the forgoing description. All changes which come within the meaning and range of equivalency of the claims are to be embrace within their scope.

What is claimed is:

1. A structure for housing multiple computer systems, the structure comprising:
   a bottom support member;
   a plurality of bottom guides mounted to the bottom support member;
   a top support member substantially parallel to the bottom support member and attached to the bottom support member by two side members;
   a plurality of top guides mounted to the top support member, wherein the top guides are substantially parallel to the bottom guides thereby enabling a computer system to slide into a computer space in between the top support member and the bottom support member; and
   a ventilating structure attached to the bottom support member and disposed outside of the computer space, the ventilating structure channeling air into a middle portion of the computer system in the computer space, wherein the ventilating structure is configured so that the air enters and exits within the ventilating structure traveling substantially horizontally having passed through only a single computer system.

2. The structure as defined in claim 1, wherein the ventilating structure includes an inlet airway positioned to provide intake air to the computer system.

3. The structure as defined in claim 1, wherein the ventilating structure includes an outlet airway positioned to exhaust used air from the computer system.

4. The structure as defined in claim 1, wherein the ventilating structure includes a plurality of airways positioned outside of the computer space.

5. The structure as defined in claim 4, wherein each airway includes an inlet airway, an outlet airway and an air dam therebetween, and wherein the inlet airway provides intake air to the computer system and the outlet airway exhausts used air from the computer system.

6. The structure as defined in claim 1, wherein the ventilating structure is integrated with the bottom support member.

7. The structure as defined in claim 1, wherein the ventilating structure is integrated with the top support member.

8. The structure as defined in claim 1, wherein the air channeled into the middle portion of the computer system is fresh air.

9. The structure as defined in claim 1, wherein the ventilating structure is further capable of exhausting used air from the middle portion of the computer system.

10. The structure as defined in claim 1 further comprising a plurality of integrated semi-locking mechanisms.

11. A structure for vertically housing multiple computer systems, the structure comprising:
    a bottom support member configured to enable vertical placement of the computer systems into a computer space within the structure;
    a top support member substantially parallel to the bottom support member and attached to the bottom support member by two side members, the top support member configured to enable vertical placement of the computer systems in the structure; and
    a ventilating structure disposed outside of the computer space, the ventilating structure channeling air into a middle portion of the computer systems in the computer space, wherein the ventilating structure is configured so that the air enters and exits within the ventilating structure traveling substantially horizontally having passed through only a single computer system.

12. The structure as defined in claim 11, wherein the ventilating structure includes an inlet airway positioned to provide intake air to the computer system.

13. The structure as defined in claim 12, wherein the ventilating structure includes an outlet airway positioned to exhaust used air from the computer system.

14. The structure as defined in claim 11, wherein the ventilating structure includes a plurality of airways positioned outside of the computer space.

15. The structure as defined in claim 14, wherein each airway includes an inlet airway, an outlet airway and an air dam therebetween, and wherein the inlet airway provides intake air to the computer system and the outlet airway exhausts used air from the computer system.

16. The structure as defined in claim 11, wherein the ventilating structure is integrated with the bottom support member.

17. The structure as defined in claim 11, wherein the ventilating structure is integrated with the top support member.

18. The structure as defined in claim 11, wherein the air channeled into the middle portion of the computer system is fresh air.

19. The structure as defined in claim 18, wherein the ventilating structure is further capable of exhausting used air from the middle portion of the computer system.

20. The structure as defined in claim 11, further comprising a plurality of integrated semi-locking mechanisms.

21. The structure as defined in claim 11, wherein the ventilating structure comprises a plurality of airways positioned outside of the computer space, wherein each airway comprises an inlet airway, an outlet airway and an air dam therebetween, wherein the plurality of inlet airways provide intake air to the computer systems, and wherein the outlet airway is used to expel used air from the computer systems.

22. A computer system for vertical placement in a computer system structure, the computer system comprising:
   a processor;
   a communications component in electronic communication with the processor for electronic communications;
   a non-backplaned communications port in electronic communications with the communications component for electronic communications;
   memory in electronic communication with the processor for storing data;
   a plurality of fans for cooling the computer system; and
   a housing for the processor, the communications component, the plurality of fans and the memory, the housing being substantially rectangular, the housing including a top, a bottom and a rear, the top including at least one top groove and the bottom including at least one bottom groove, the top and bottom grooves being configured whereby the computer system is vertically placed into the computer system structure, and wherein the top includes top venting and wherein the bottom includes bottom venting whereby the plurality of fans operate to ventilate the computer system through use of the top venting and the bottom venting, wherein at least one of the top venting and bottom venting are positioned for use with a ventilating structure configured so that air enters and exits within the ventilating structure traveling substantially horizontally having passed through only the single computer system.

23. The computer system as defined in claim 22, wherein the ventilating structure comprises a plurality of airways positioned outside of a computer space.

24. The computer system as defined in claim 23, wherein at least one of the bottom venting and top venting includes an inlet airway, an outlet airway and an air dam therebetween, and wherein the inlet airway provides intake air to the computer system and the outlet airway exhausts used air from the computer system.

25. An electronic component for vertical placement in a sub rack structure of the computer system as defined in claim 22, the electronic component comprising:
   a printed circuit board;
   a bottom on which the printed circuit board is mounted;
   a first side connected to the bottom, wherein the first side includes first side vents;
   a second side connected to the bottom, wherein the second side includes second side vents; and
   whereby the electronic component may be vertically placed into the sub rack structure such that the first side and the second side are vertically aligned, and wherein the vents operate to ventilate the electronic component by allowing air to flow through the vents.

* * * * *